United States Patent
Andry et al.

(10) Patent No.: US 6,872,974 B2
(45) Date of Patent: Mar. 29, 2005

(54) LOW THRESHOLD VOLTAGE INSTABILITY AMORPHOUS SILICON FIELD EFFECT TRANSISTOR STRUCTURE AND BIASING FOR ACTIVE MATRIX ORGANIC LIGHT-EMITTING DIODES

(75) Inventors: Paul S Andry, Mohegan Lake, NY (US); Frank R Libsch, White Plains, NY (US); Tsujimura Takatoshi, Fujisawa (JP)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 10/300,548

(22) Filed: Nov. 20, 2002

(65) Prior Publication Data

US 2003/0094616 A1 May 22, 2003

Related U.S. Application Data

(60) Provisional application No. 60/331,918, filed on Nov. 20, 2001.

(51) Int. Cl.[7] .......................... H01L 29/04; H01L 31/20
(52) U.S. Cl. ..................................................... 257/59
(58) Field of Search ......................... 257/49, 52, 57, 257/59, 61, 66, 72, 88; 438/30, 34, 149, 29

(56) References Cited

U.S. PATENT DOCUMENTS

| 5,034,340 A | 7/1991 | Tanaka et al. ................. 437/41 |
| 5,132,745 A | 7/1992 | Kwasnick et al. ............. 357/4 |
| 5,311,040 A | 5/1994 | Hiramatsu et al. ............. 257/57 |
| 5,684,555 A * | 11/1997 | Shiba et al. ................. 349/149 |
| 5,952,789 A | 9/1999 | Stewart et al. ............... 315/169 |
| 6,023,259 A | 2/2000 | Howard et al. ............... 345/76 |
| 6,107,640 A * | 8/2000 | Park et al. ..................... 257/59 |
| 6,229,506 B1 | 5/2001 | Dawson et al. ............... 345/82 |
| 6,229,508 B1 * | 5/2001 | Kane ............................ 345/82 |
| 2001/0030323 A1 * | 10/2001 | Ikeda ........................... 257/59 |

FOREIGN PATENT DOCUMENTS

GB  WO 94/25954  * 11/1994  ............ G09G/3/36

* cited by examiner

Primary Examiner—Carl Whitehead, Jr.
Assistant Examiner—Jennifer M. Dolan
(74) Attorney, Agent, or Firm—Ohlandt, Greeley, Ruggiero & Perle, LLP

(57) ABSTRACT

A circuit for providing a current to an organic light emitting diode comprising: (a) an amorphous silicon field effect transistor having a gate electrode and a drain electrode through which the current is provided to the organic light emitting diode; and (b) a controller for controlling a bias between the gate electrode and the drain electrode to maintain a threshold voltage shift of less than about 1V. The organic light emitting diode is preferably a component in an active matrix.

13 Claims, 15 Drawing Sheets

Cross-section of TFT with idential processed films except that the gate interface (<500A) flim adjacent to the a-Si TFT channel is either (10A) CVD SiOx (top), or (10B) CVD SiNy (bottom).

TFT UNDER TEST Cross-Section: SiOx/a-Si:h vs SiNx/a-Si:H GI TFTs

Cross-section of TFT with idential processed films except that the gate interface (<500A) flim adjacent to the a-Si TFT channel is either (10A) CVD SiOx (top), or (10B) CVD SiNy (bottom).

Cross-section of TFT with idential processed films except that the gate interface (<500A) flim adjacent to the Mo gate electrode is either (A) a high temperature, high pressure CVD SiOx (top) or (B) a low temperature, low pressure CVD SiOx (bottom).

LOW THRESHOLD VOLTAGE INSTABILITY AMORPHOUS SILICON FIELD EFFECT TRANSISTOR STRUCTURE AND BIASING FOR ACTIVE MATRIX ORGANIC LIGHT-EMITTING DIODES

The present invention claims priority to U.S. Provisional Patent Application No. 60/331,918, filed on Nov. 20, 2001.

The present invention is generally related to bias conditions and geometrical structures for amorphous silicon field effect transistors (FETs). More particularly, the present invention is directed to an amorphous silicon FET structure within a pixel that is directly supplying the current to the organic light emitting diode (OLED) and bias condition of that FET which reduces the threshold voltage instability with time and which does not degrade the performance of the device to deliver the needed current and gray scale. The resulting FET device and bias conditions are particularly useful in matrix addressed organic light emitting diodes (OLEDs).

BACKGROUND OF THE INVENTION

Despite abundant conjecture to the contrary, it has been established for the first time that amorphous silicon (a-Si) technology is more than adequate to meet the pixel current drive requirements of an active matrix organic light-emitting diode (AMOLED) display. Prevailing wisdom, based almost exclusively on the industry's familiarity with AMLCD a-Si backplanes, suggests that even if current drive requirements can be met using a-Si thin film transistor (TFT), the well-known threshold instability of such devices precludes their use in a voltage-programmed active matrix design, since any loss of current drive in the OLED element results directly in a loss of luminance, whereas in an AMLCD, loss of TFT current results only in an increase in the pixel capacitance charging time (on the order of $\mu s$) rather than in a change in the final voltage, hence luminance levels may remain unchanged for voltage shifts as large as 10V for AMLCDs. It should be pointed out, however, that the range of voltages and the drive regime of the current drive TFT in an AMOLED display are, and in fact must be, dramatically different. Refer to a FIG. 1A showing typical one TFT AMLCD pixel circuit schematic, and an illustrative FIG. 1B showing a two TFT AMOLED pixel. Consider the TFT in FIG. 1A which serves only as a switch in charging the parallel combination of pixel LC capacitance (CLC) plus the storage capacitance (Cs). This switch has a duty cycle of 100/#R where #R is the total number of rows in the display, which typically ranges from 640 to 1200 for the most common designs available today with pixel content of VGA to SXGA. At a 60 Hz refresh rate, this corresponds to switching times ranging from 26 to 14 $\mu s$. In order to write the proper data voltage, Vd, which ranges typically from 2V to 12V (a +5 to −5 V range about the common voltage of approximately 7V, on alternating frames). The gate voltage, Vg, of the switching TFT is typically taken from an OFF level of about −5 V to an ON level on the order of +25 V. In this scenario, the switching TFT is always operating in the linear regime with Vg−Vth>Vd when the pixel is charging, going through saturation only briefly when the switching gate pulse is turned on or off while Vd is constant, where Vth is the TFT threshold voltage In an AMOLED display, the luminance level is not a function of the final voltage applied to the LC cell, but rather is a function of the current level supplied by a drive TFT (see FIG. 1B). The switch TFT operates in the same fashion as the single TFT in the AMLCD unit cell. However, the data voltage is written onto a storage capacitor attached to the gate of the current drive transistor, and it is the threshold stability of this current drive TFT which must remain stable over a long period of operation (i.e., a good fraction of the frame time) for the AMOLED display to be commercially useful.

The belief in this technology area has always been that amorphous silicon TFTs do not have the performance needed for integration into the matrix addressed pixel to drive OLEDs (J. Kanicki et al, SID 20th IDRC Proceedings, September 25–28, Palm Beach, Fla., pp 354–358) and that all prototypes and products to date reflect this belief by using poly-silicon TFT technology.

The present inventors have developed the following unique drive schemes tailored explicitly to combat threshold shift, thus making the use of a-Si technology practical for AMOLED. Providing for amorphous silicon TFTs to meet the AMOLED requirements, such as that provided by the present invention, the less expensive amorphous silicon (a-Si) TFT technology compared to the more costly poly-SI TFT technology would provide substantially lower manufacturing cost.

The present invention also provides many additional advantages which shall become apparent as described below.

SUMMARY OF THE INVENTION

The present invention is directed to an amorphous silicon FET structure within a pixel that is directly supplying the current to the organic light emitting diode (OLED) and bias condition of that FET which reduces the threshold voltage instability with time and which does not degrade the performance of the device to deliver the needed current and gray scale. The resulting FET device and bias conditions are particularly useful in matrix addressed organic light emitting diodes (OLEDs).

The present invention is a circuit for providing a current to an organic light emitting diode comprising: (a) an amorphous silicon field effect transistor having a gate electrode and a drain electrode through which the current is provided to the organic light emitting diode; and (b) a controller for controlling a bias between the gate electrode and the drain electrode to maintain a threshold voltage shift over time of less than about 1V. The organic light emitting diode is preferably a component in an active matrix.

The bias is a condition selected from the group consisting of: range of voltage applied between the gate electrode and the drain electrode, and duration of voltage applied between the gate electrode and the drain electrode. The range of voltage difference applied between the drain electrode and the gate electrode is in the range between about −Vth to 20V. The range of duration for applying voltage between the gate electrode and the drain electrode is between about 1% to 99.9% of the frame time.

For the case of average resolution AMOLED display (i.e., about 75 pixels-per-inch to 150 ppi) of average brightness (in the range of about 50 to 500 $Cd/m^2$), the current is preferably in the range from about 10 nA to 10 $\mu A$. The current is inversely proportional to the pixel fill factor of the OLED, inversely proportional to the illumination duty cycle (i.e., ratio of OLED illumination on-time-to-frame-time, multiplied by 100 percent), proportional to the pixel area, inversely proportional to the organic film efficiency, and proportional to the pixel brightness.

The field effect transistor is typically a thin film transistor. The field effect transistor comprises: a substrate; the gate electrode deposited upon a surface of the substrate; a first amorphous $SiO_x$ layer disposed on the gate electrode; a second amorphous $SiO_x$ or $SiN_x$ layer deposited on at least a portion of the first amorphous $SiO_x$ layer; a first amorphous silicon layer deposited on the second amorphous $SiO_x$ or $SiN_x$ layer; a third amorphous $SiN_x$ layer deposited on at least a portion of the first amorphous silicon layer; a second amorphous silicon layer deposited on a first and second side portions of the third amorphous $SiN_x$ layer; the drain electrode deposited on either the first or second side portions of the second amorphous silicon layer; and the source electrode deposited on the side portion of the second amorphous silicon layer other than the side portion upon which the drain electrode is deposited, where the drain electrode and source electrode may be deposited at the same time and defined by the same photolithography step Other and further objects, advantages and features of the present invention will be understood by reference to the following specification in conjunction with the annexed drawings, wherein like parts have been given like numbers.

DESCRIPTION OF THE PREFERRED EMBODIMENTS

Figure 1A:
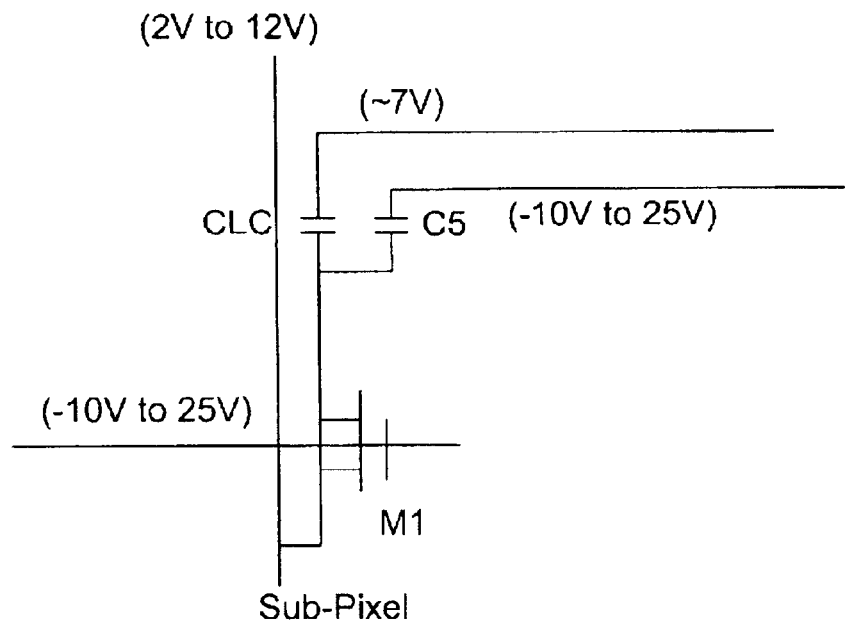
FIG. 1a illustrates a conventional one thin film transistor (TFT) active matrix liquid crystal (AMLCD) pixel.
Figure 1B:
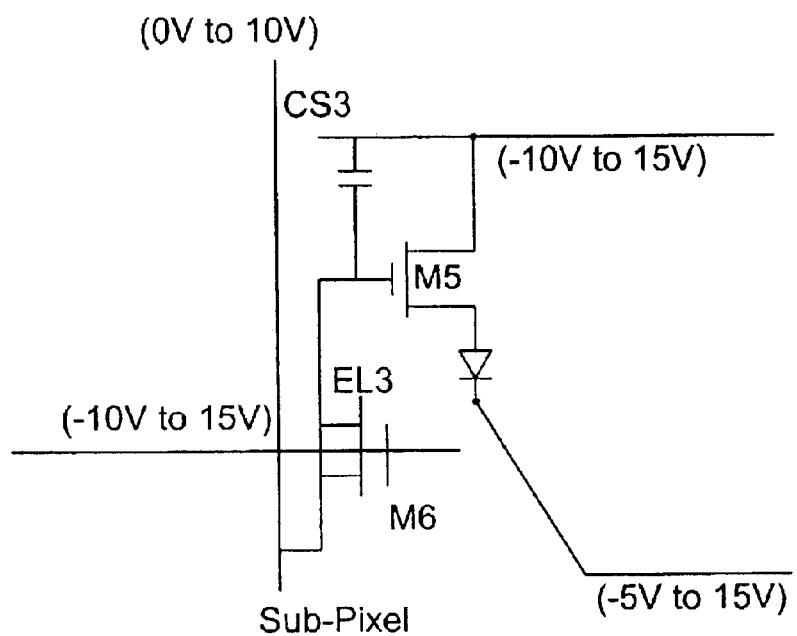
FIG. 1b illustrates a conventional two thin film transistor (TFT) active matrix organic light-emitting diode (AMOLED) pixel.
Figure 2A:
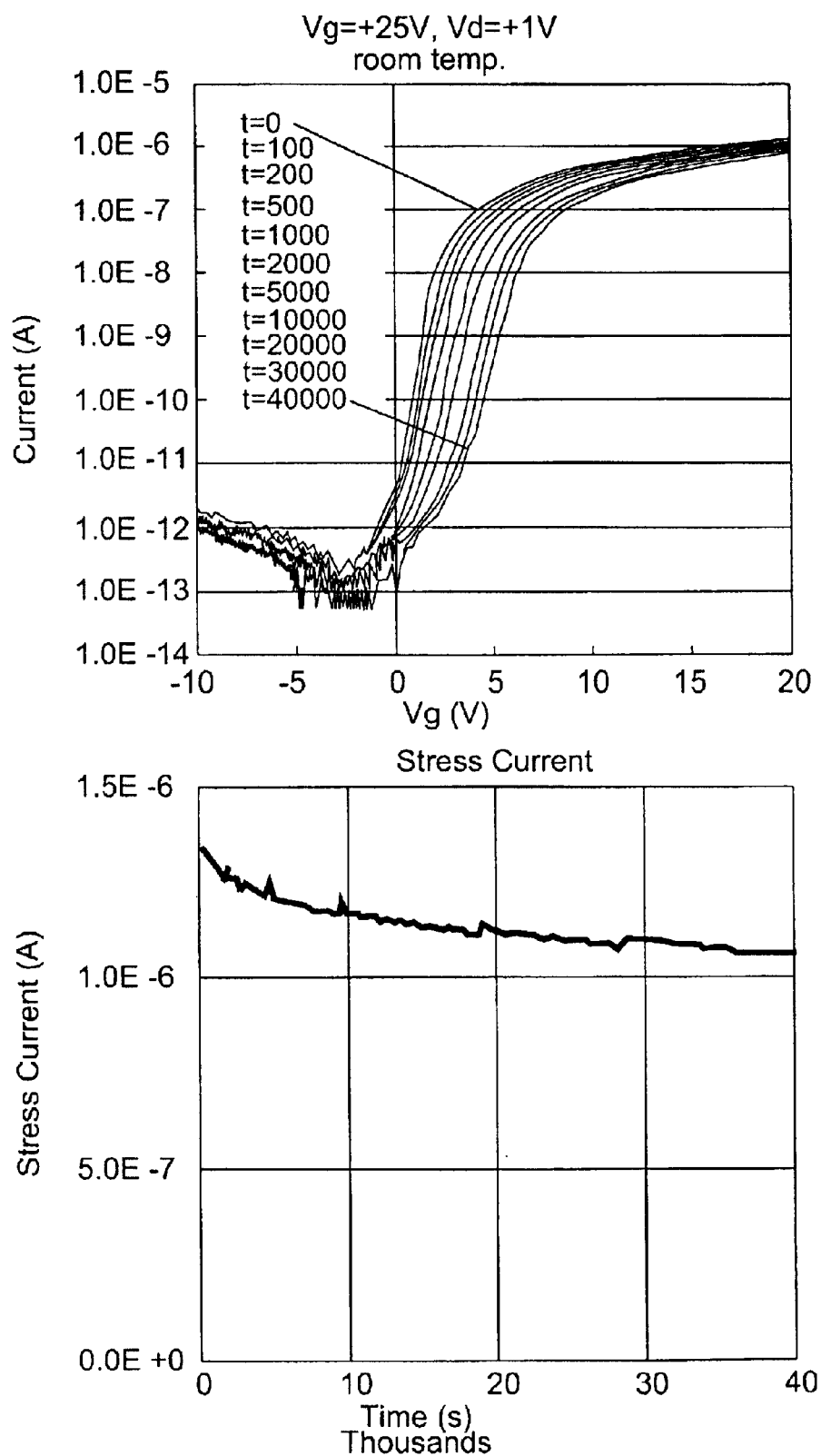
FIG. 2a are graphs plotting drain current versus gate bias as a function of stress times from 0 to 40,000 seconds, and stress current versus time for TFT with W/L equal to 50/7 driven in linear regime (Vg=25 V, Vd=1 V, Vs=0V)
Figure 2B:
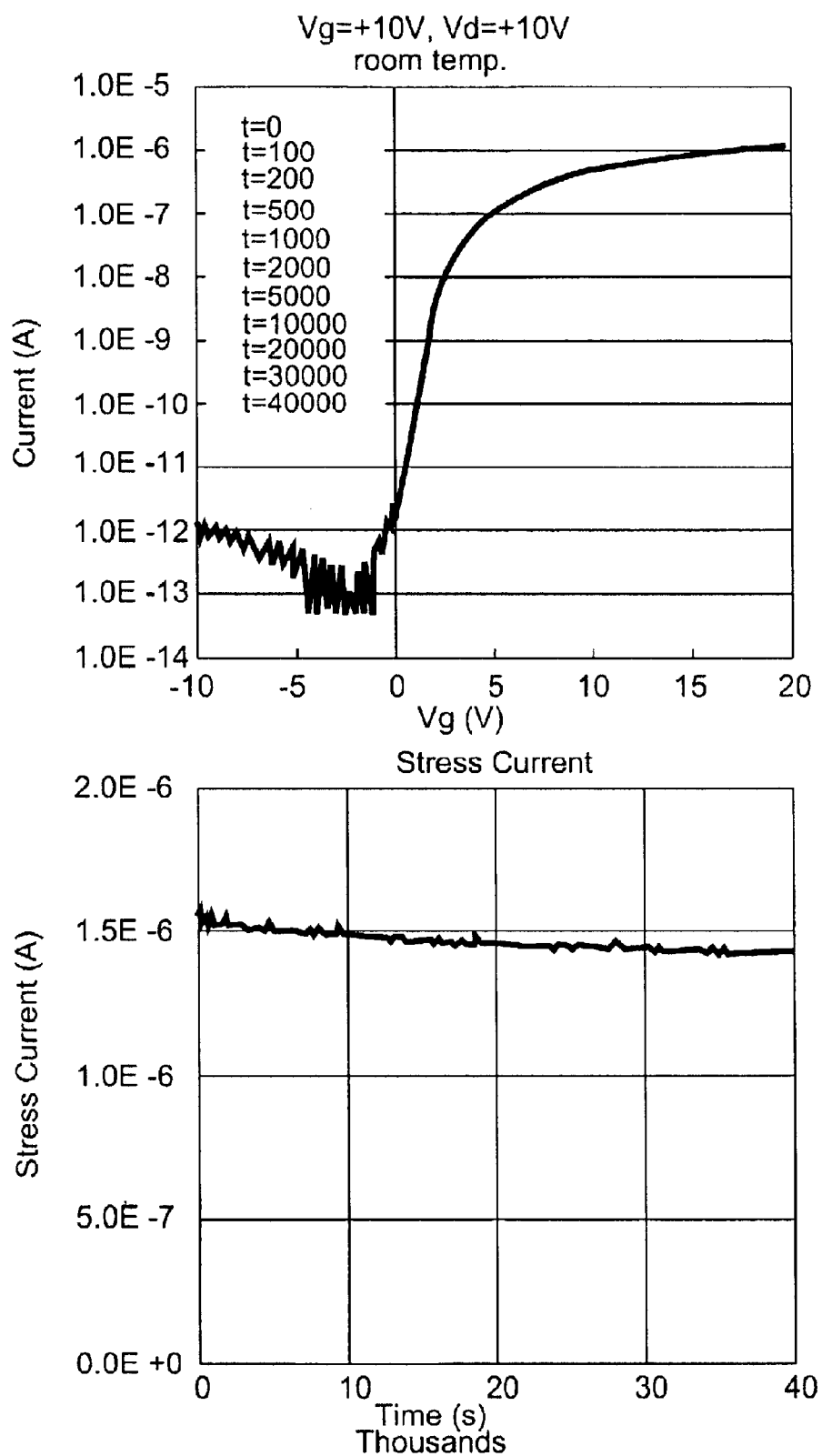
FIG. 2b are graphs plotting drain current versus bias and stress current versus time for TFT with W/L equal to 50/7 driven in saturation regime (Vg=Vd=10 V)

As a point of introduction, consider FIGS. 2A and 2B below. Both show threshold shift and drive current results for geometrically identical, neighboring TFTs from the same substrate, but in two quite different modes of operation. FIG. 2A shows the first TFT in the linear regime of operation with Vg=+25 V, and Vd=+1V (the source is grounded). FIG. 2B shows the neighboring TFT in the saturation regime with Vg=Vd=+10 V. Note that these voltages yield fairly similar drive currents, starting at approximately 1.40 µA for the TFT of FIG. 2a, and approximately 1.55 µA for the TFT in FIG. 2b. It is readily apparent that these conditions lead to dramatically different threshold stability in the nominally identical devices, namely, after 40,000 seconds of continuous (DC) stress at room temperature, the threshold shift (ΔVT) of the first TFT is approximately 4.0 V, while that of the second TFT is only approximately 0.25 V. It is clear that there are ranges of voltage which are clearly more suitable for driving a given current where stability is of primary concern.

Figure 3A:
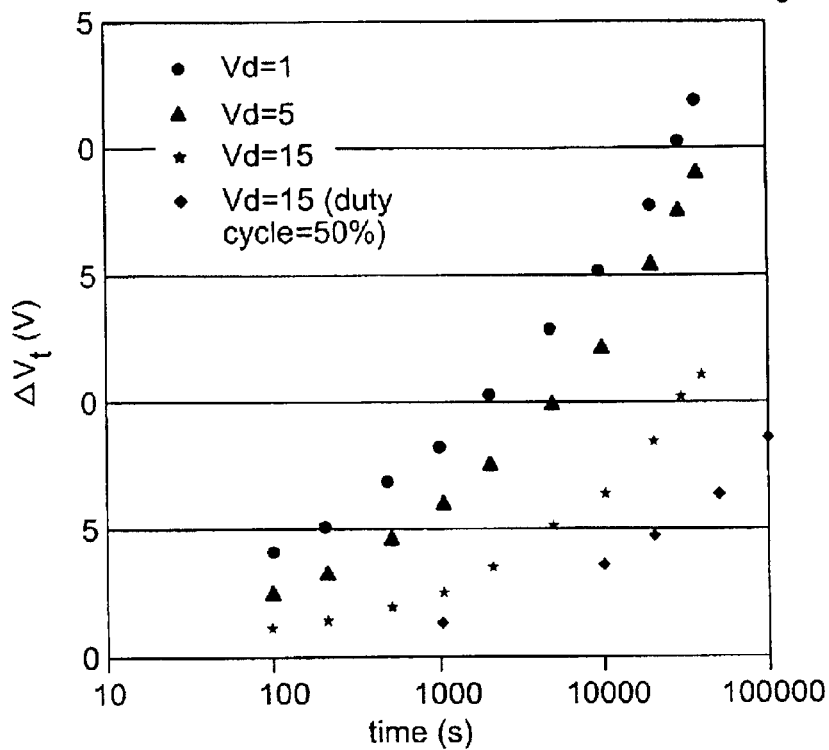
FIGS. 3a and b are graphs plotting threshold shift versus stress time as a function of Vd showing TFT stability for Vg=15 V and Vs=0V fixed for both a semilog plot and log-log plot, respectively.
Figure 3B:
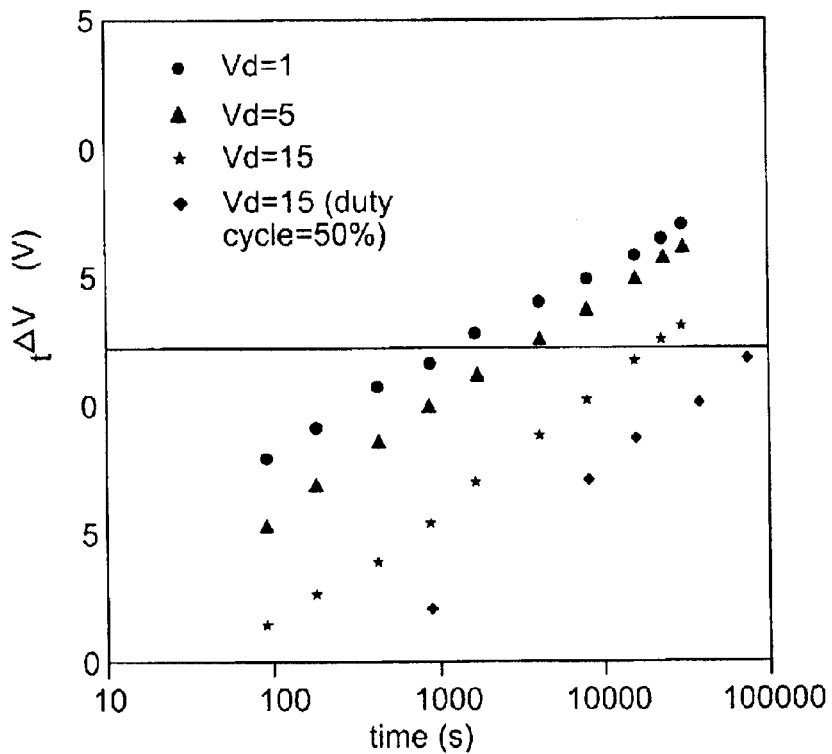

Since it has been established that threshold instability may result from both injection of carriers into the SiNx gate insulator as well as breaking of weak bonds at the a-Si/SiNx interface (F. R. Libsch and J. Kanicki, Applied Physics Letters, Vol. 62, No. 11, pp1286–1288), there exists a notion that a-Si is unsuitable for current driving since neither mechanism can be fully mitigated. Because sustained TFT current densities are needed for good OLED brightness, it is assumed that degradation of the near-interface region of the a-Si channel will only worsen the threshold shift problem. As will be shown below, by correct sizing of the unit cell TFTs and storage capacitor, the current density requirements for OLED can easily be met. Moreover, we show clearly in FIG. 3, that contrary to what some might expect, for PECVD materials of sufficiently high quality, a TFT driven in saturation is actually much more stable against threshold shift than the same TFT driven in the linear regime for any practical value of Vg. In FIG. 3, Vg is fixed at 15 V, and there is a clear trend of improved stability as the drain voltage is increased from 1 V to 15 V. It should be noted that for Vd=1, the current was 0.8 µA while at Vd 15 the current was 8.0 µA. Despite a 10× increase in current density, we see a decrease of more than 2× in ΔVT at any given time. A further 2× improvement in stability results from reducing duty cycle from 100% to 50% as shown. Thus, TFT saturation regime biasing and duty cycle are important considerations in the a-Si AMOLED design.

Figure 4:
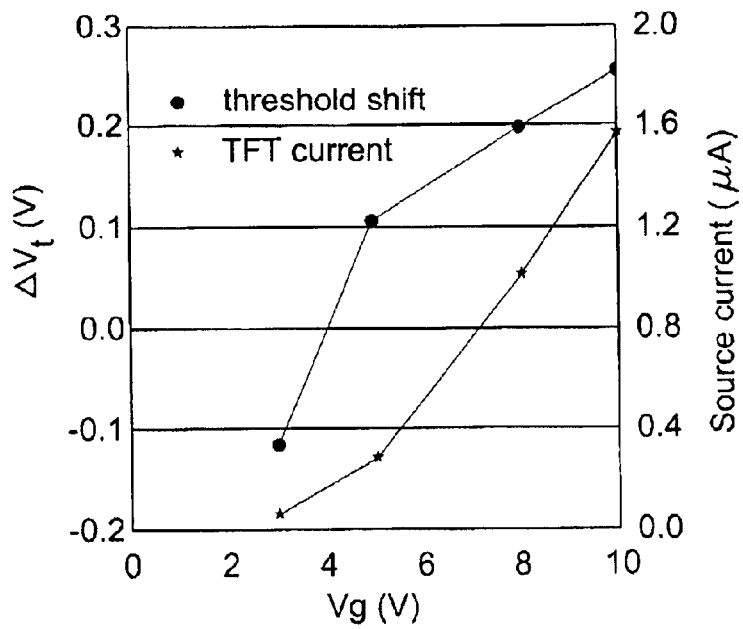
FIG. 4 is a graph plotting threshold shift versus gate bias for TFT drain current and corresponding threshold shift for fixed Vd=10 V (100% duty)

The results above lead us to conclude that a practical driving scheme for AMOLED must ensure that little or no shift of the current drive TFT takes place by simultaneously controlling the range and duration of voltage applied to both the gate electrode and the drain electrode. Effectively, this requires defining a set range of gate bias, a corresponding drain bias range and an appropriate set of waveforms (i.e., duty cycles for each) such that the net result leads to net compensation of the shift instability. The exact set of bias ranges and waveforms will depend on the a-Si and SiNx materials properties, and accordingly these must be optimized and the film deposition conditions known. That such a scheme is workable can be understood from FIG. 4. Here a simple experiment with a fixed drain bias of 10V and a variable gate bias from 0 to 10 V (both DC in this case) demonstrates how partial compensation can be achieved simply by driving the TFT deeper in saturation. A useful set of drive currents from about 50 nA up to more than 1.5 µA (grayscale) exist for gate bias from 3 to 10 V, and we note that for Vg less than about 4 V, the threshold shift is negative. In general, to account for various pixel size designs, a pixel current normalized by area may be more useful. In general, useful pixel current densities are less than 20 mA/cm². For NTSC type application we expect the panel bias conditions to average to mid-gray over the panel lifetime, hence we may choose the appropriate set of signals to give us zero shift at a target current level.

Experimental Results

It was experimentally determined by the inventors that a-Si TFTs driven in saturation always exhibit less threshold shift for a given Vg than when driven in the linear regime (small Vd typically 0.1 to 1.0 V). This was found to be universally true and has been verified in many single PECVD gate insulator material combination as we as devices which employ a composite SiOx/SiNx gate insulator (GI). All SiNx gate insulators, typically exhibit half the shift in saturation that occurs in the linear regime, despite the fact that the current in the channel is usually an order of magnitude greater with Vd=Vg. In fact, it was quickly determined that there is continuous improvement in threshold stability for a given device as Vd is increased from 0 to Vg, and even beyond. This trend is shown in FIG. 3 for a serpentine driver TFT from AMOLED. The log-log plot shows that there is no dramatic change in the slope for increasing Vd, but rather an apparent decrease in the constant prefactor—the net result of which is up to an order of magnitude difference in the stress time required to give a particular $\Delta V_T$.

Figure 5:
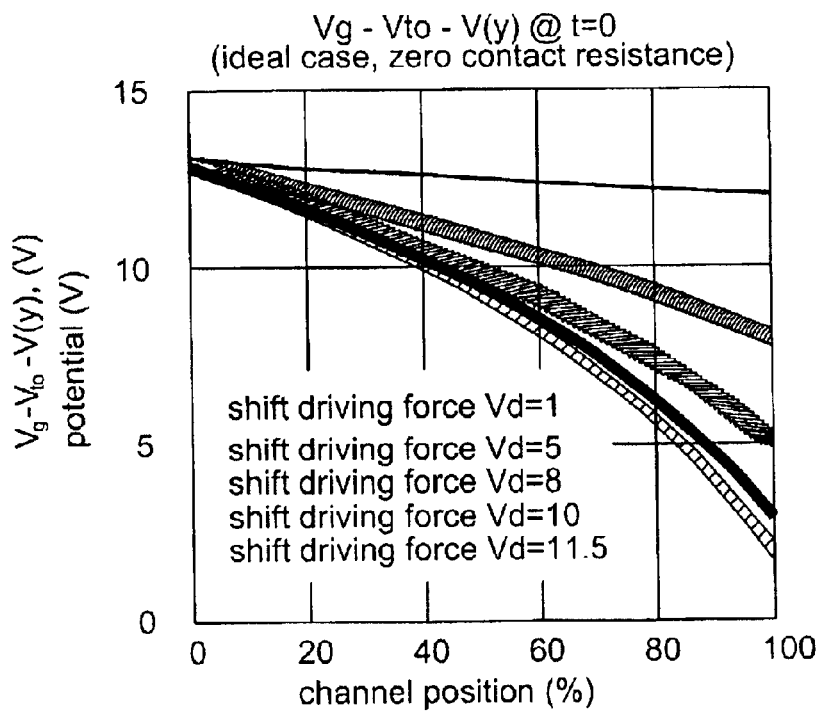
FIG. 5 is a graph plotting the gate driving prefactor versus the TFT channel position for various Vd biases; where channel position 0% and 100% correspond to the source-to-channel contact and the drain-to-channel contact, respectively.
Figure 6A:
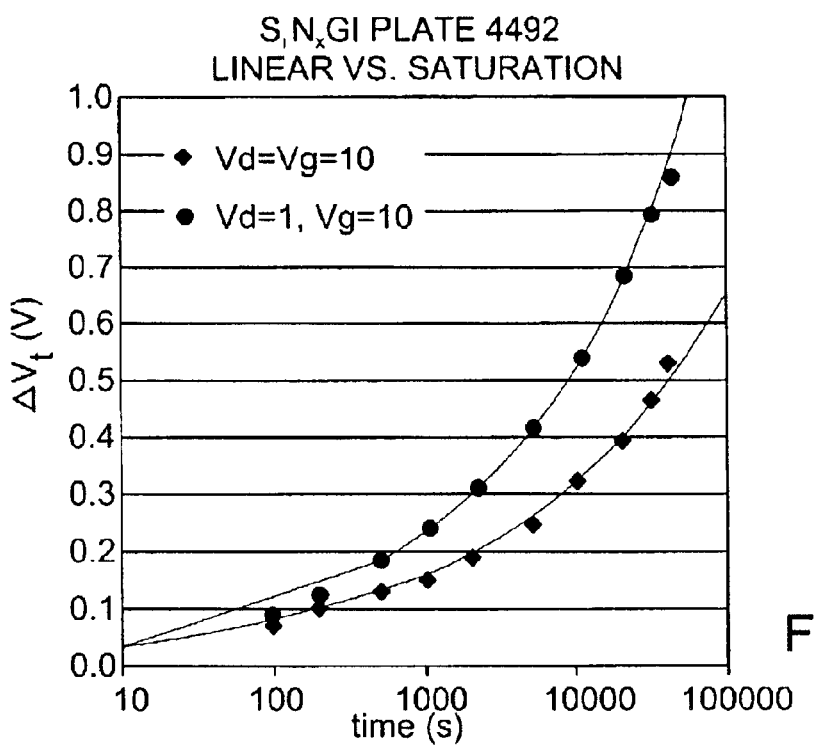
FIG. 6a is a graph plotting the TFT threshold voltage shift versus stress time for bias conditions of Vg=10V and two drain voltages of Vd=1V, and Vd=10V, for a single layer PECVD $SiN_x$ gate insulator film.

It does not take long to realize that the experimental behavior is entirely to be expected, although the magnitude of the benefit requires some calculation. The threshold shift model takes the form shown in Eq. 1, where the prefactor $V_0$ is assumed to be the gate drive, or $V_0 \sim (V_g - V_{T0})$, with $V_{T0}$ equal to the initial threshold of the device before stress. As long as $$\Delta V_T = |V_0|\{1-\exp(-t/\tau)^\beta\} \qquad (1)$$

the condition Vd<<Vg (e.g. Vs=0, Vd=0.1 V, Vg>5) is satisfied during the stress experiment, then the field across the gate insulator is essentially uniform from the source to the drain, and Eq. 1 is directly applicable. As Vd is increased however, one must take into account the voltage drop along the channel, V(y), from drain, V(y)=Vd, to source, V(y)=Vs, and incorporate this into the model by replacing the constant prefactor in Eq. 1 with the function $[V_g - V_{T0} - V(y)]$, 0. Calculation takes place in three parts. First the initial potential distribution from source to drain is calculated using initial conditions including Id@t=0 by means of the standard long channel approximation given in Eq. 2. It is helpful to assume a polynomial form for V(y) and proceed by self-consistent iteration until the desired $$dV(y)/dy = Id/[W\mu Ci(Vg-V_T-V(y)] \qquad (2)$$

accuracy is achieved. A family of position-dependent "driving force" potentials calculated using the starting D/S channel potentials is given in FIG. 5. In the second part of the simulation, the starting prefactor profile is then fed into Eq. (1) and the numerical calculation of Id is initiated using logarithmic timestep intervals. After each shift recalculation, the prefactor at any point along the channel changes, and numerical integration of Eq. 2 yields a value for Vd which must be scaled down to its constant value by decreasing Id proportionally. What results from this simulation is an Id decay curve. Examples of these are shown in FIG. 6a. In the last part of the simulation, the effective threshold shift $\Delta V_T$ is calculated by comparing the Id decay curve at constant gate field (i.e. the original model for Vd<<Vg) with the simulated curve. This is necessary because each element of the channel length from source to drain will have shifted by lessening amounts, leaving a threshold shift profile across the device which resembles the original potential drop. Thus, we have to calculate an "integrated" shift based on the current. Examples of the effective threshold shifts as a function of Vd are shown in FIG. 6b.

Figure 6B:
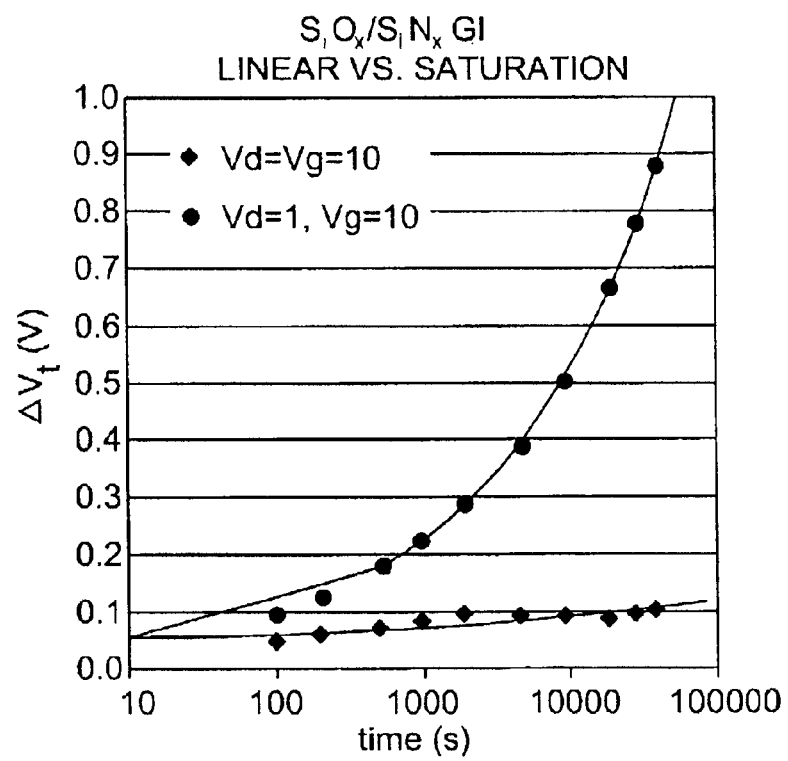
FIG. 6b is a graph plotting the TFT threshold voltage shift versus stress time for bias conditions of Vg=10V and two drain voltages of Vd=1V, and Vd=10V, for a dual layer of SiOx/SiNy gate insulator film.

Simulated (lines) and data (points) current decay curves using the modified theory which takes the D/S potential into account are shown in FIG. 6a and FIG. 6b. FIG. 6a and FIG. 6b each show two different bias conditions, corresponding to the effective TFT threshold voltage shift that would result if the TFT is biased in (1) the linear region (for example, for Vd=1, Vg=10V), where the stress is a uniform driving field across the GI everywhere along the channel, and (2) the saturation region (for example, Vd=Vg=10V). The difference between the two sets of curves shows the relative improvement in stability that is achieved as Vd approaches Vg.

Simulated effective threshold shifts for Vd approaching saturation are shown in FIG. 6b. The decay parameters β and τ were extracted from the Vd=1 data curve shown in FIG. 3. A comparison of the figures shows the additional influence of the gate insulator film. FIG. 6a shows threshold voltage versus time results for a TFT with GI film composed of one amorphous SiNx layer before the deposition of the first amorphous silicon layer. FIG. 6b shows threshold voltage versus time results for a TFT with GI film composed of a first amorphous $SiO_x$ layer disposed on the gate electrode followed by a second amorphous $SiN_x$ layer before the deposition of the first amorphous silicon layer.

For the moment we cannot precisely calculate the shift once saturation has been reached, since the channel field completely collapses near the drain, and this requires another modification to calculate how fast the pinch-off point moves away from the drain as Vd is further increased. Regardless, the boundary conditions indicate that the field across the gate insulator near the drain must actually reverse up to the classical pinch-off point, which assures us that there is only benefit in driving the TFT deeper into saturation as long as no degradation of the a-Si near the drain takes place. This appears to be an area where a-Si probably has an advantage over poly-Si since large fields near the drain of poly-Si TFTs are known to cause instability problems. One final observation which was first seen in the data of FIG. 3, and verified above in FIG. 6a and FIG. 6b, is that the slope of the effective threshold shift vs. time on a log-log plot does not change appreciably as Vd is increased, but the entire curve is depressed i.e. the "effective" prefactor is lowered. For the conditions simulated above (Vg=15, $V_{T0}$=2) we find the prefactor is reduced to 80%, 68% and 54% of its original value as Vd is increased from a small value to 5, 8 and 11.5 V, respectively. The trend verifies the experimental observation that (for Vg=15 data) the shift at any time for Vd=Vg is slightly less than half of its value when Vd<<Vg.

Figure 7:
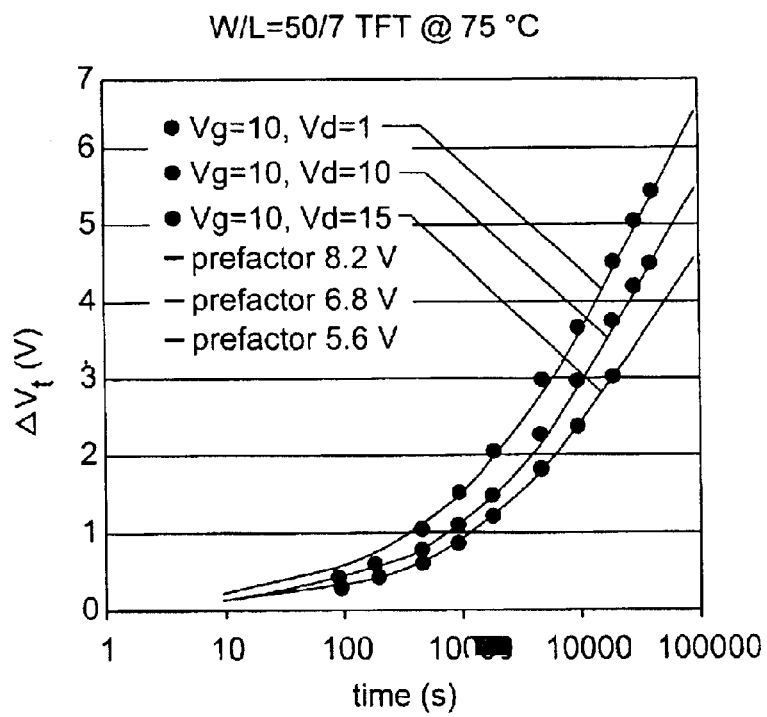
FIG. 7 is a graph depicting the accelerated bias temperature stress at 75 C showing that the gate drive prefactor reduction benefit exist in the TFT saturation regime even at higher temperatures.

We may confirm that the reduction of the effective $\Delta V_T$ prefactor truly persists throughout the lifetime of the TFT by accelerating the shift using high temperature BTS. FIG. 7 shows the stabilizing effect of driving the TFT in saturation at 75° C. Note how the effective prefactor decreases as Vd is increased from 1, to 10 and 15 V respectively for a fixed gate bias of Vg=10 V. All other shift model parameters were held constant. Accelerated shift results at 75° C. show the benefit of saturation drive persists throughout the lifetime of the TFT as depicted in FIG. 7.

Projected a-Si TFT Lifetimes Based on DC and AC Stress: Finding an Operational Window At the heart of the question of a-Si feasibility lies a fundamental challenge, i.e., to establish a window of acceptable stability using all of the parameters under our control, namely PECVD materials properties, maximum bias values, duty cycle and driving schemes which may include compensation. It was quickly determined that for "standard" TFT SiNx gate insulator properties, gate voltages beyond about 10 V lead to unacceptably large shifts. For example, the Vg=15 V, Vd=11.5 V simulations of TFTs in FIGS. 6a and 6b show that the ON current decays to 80% of its starting value after only 27 hours, and to 50% at a projected time of 440 hours. For this reason, we began concentrating our efforts on a lower gate bias regime where ON currents were still more than adequate to drive OLEDs brightly. Table I shows the extrapolated room temperature lifetimes (defined for the moment as the time in hours for the saturation drive current to reach half of its initial value) based on power law fits to TFT data for a variety of different GI recipes, GI thicknesses, bias voltages and duty cycles. Note that projected lifetimes are conservative in the sense that they are simple power law fits, i.e., they are linear on a log-log plot. We know from theory (and have verified by high temperature experiments) that the boundary conditions require that the log-log curves begin to bend downwards noticeably when $\Delta V_T$ grows beyond approximately 10% of Vg. In other words, we extrapolate the half-life based on an early shift rate which is known to decrease with time. In this way, we may consider the projected times as upper limits for their particular conditions.

TABLE I (Projected current half-lives for a variety of TFTs and bias conditions)

| plate | GI SiNx thickness (Å) | Vg/Vd (V) | duty (%) | $Id_0$ (uA) | GI $E_{max}$ (kV/cm) | Vto (V) | $\Delta V_T$ (½) (V) | t (½) (hours) |
|---|---|---|---|---|---|---|---|---|
| 4306 | 3900 | 10/10 | 100 | 4.3 | 256 | 1.3 | 2.5 | 730 |
| 4306 | 3900 | 10/15 | 100 | 4.7 | 256 | 1.5 | 2.5 | 900 |
| 4306 | 3900 | 10/10 | 50 | 4.3 | 256 | 1.4 | 2.5 | 2500 |
| 4492 | 3300 | 12/10 | 100 | 6.3 | 364 | 1.6 | 3.0 | 180 |
| 4492 | 3300 | 10/10 | 100 | 3.6 | 303 | 1.8 | 2.4 | 400 |
| 4492 | 3300 | 8/10 | 100 | 2.4 | 242 | 1.9 | 1.8 | 4200 |
| 4492 | 3300 | 10/10 | 50 | 3.6 | 303 | 1.8 | 2.4 | 1800 |
| 4492 | 3300 | 8/8 | 50 | 2.1 | 242 | 1.8 | 1.8 | 1900 |
| 4668 | 2550 | 10/10 | 100 | 6.5 | 392 | 1.1 | 2.6 | 200 |
| 4668 | 2550 | 8/10 | 100 | 3.6 | 314 | 1.1 | 2.0 | 420 |
| 4668 | 2550 | 6/10 | 100 | 1.5 | 235 | 1.1 | 1.4 | 450 |
| 4668 | 2550 | 10/10 | 50 | 6.5 | 392 | 1.1 | 2.6 | 1620 |
| 4668 | 2550 | 10/10* | 50 | 6.5 | 392 | 1.2 | 2.6 | 3200* |
| 4668 | 2550 | 8/10 | 50 | 3.6 | 314 | 1.1 | 2.0 | 3300 |
| 4668 | 2550 | 5/10 | 50 | 1.0 | 196 | 1.1 | 1.1 | 3900 |

*denotes that the AC low level was set at −2 V instead of zero to investigate compensations While data were collected on many plates, Table I shows a collection for three in particular. Plate 4306 had a thick gate insulator deposited using our "standard" TEL PECVD SiNx, plate 4492 had a thinner TEL SiNx GI which employed $H_2$ dilution, and plate 4668 had all Balzers Kai PECVD materials and the thinnest GI SiNx of them all. The starting ON currents, $Id_0$, are specified for driver TFTs which have W/L=100/7, the same driver TFTs used in the 40 mm AMOLED display. Note that each 1.0 uA of drive current corresponds to a pixel current density of approximately 9 $mA/cm^2$ in the actual display, so that the test conditions which is more than sufficient to achieve good AMOLED brightness according to ZRL data. Some entries correspond to 60 Hz/50% duty data rather than DC data. Unless otherwise noted, the AC low level is zero volts. There are a couple of fairly clear trends: 1) AC operation results in much greater stability than DC operation for the same bias conditions, 2) a thicker GI (i.e. lower maximum electric field across the GI) generally results in greater stability for the same bias conditions, 3) lower gate bias (i.e. lower maximum electric field across the GI) results in greater stability for a given gate insulator thickness, and 4) a low negative gate bias replacing the zero volt bias during a portion of the AC operation can result in a lower TFT threshold voltage shift. All of these results agree with the fundamental assumptions contained within the threshold shift model. Moreover, the trend of the data suggests that we may indeed define an operational window wherein a-Si TFTs will be sufficient to supply the required AMOLED drive current, and at the same time sufficiently stable for TV application. There are a number of reasons for making this optimistic claim. First, the data from Table I show that the half-life improvement seen by decreasing the duty cycle from 100% to 50% is not simply linear; the data show an increase in lifetime ranging from a factor approximately 3 to 8 for the same bias conditions. Since we expect perceived brightness to decrease by only 50%, then by proper design of the driver TFT we take advantage of improvement in lifetime. One may also note that as OLED material efficiency improves with time, further reduction in duty cycle should lead to further superlinear improvement in lifetime. Another reason to be optimistic is that for television (TV) applications, the entire display should average to some midgray level rather than to the "full ON" state given by data (Vg of driver TFT) of 10 V, so the 50% duty cycle lifetimes ranging from about 1600 to 2500 hours are worst case (every pixel full on), not the typical scenario. Some of the longer times of closer to 4000 hours are more reasonable in this respect. There is however an even more compelling reason to expect that a-Si technology is feasible, and this hinges on the fact that not all gate insulators behave the same way under stress—as it turns out, the composite GI stack of SiOx/SiNx exhibits some striking differences from the pure SiNx deposited GI stack. FIGS. 6a and 6b, show all-SiNx GI TFT and a SiOx/SiNx GI TFT, respectively, under identical linear and saturation bias conditions. In the linear regime (for example, Vd=1V, Vg=10V curves) both devices exhibit nearly identical shifts with time, suggesting not only a common controlling mechanism, but similar parameter values. In saturation (for example, Vg=Vd=10V curves), however, only the pure SiNx deposited GI stack device follows the modified model; the SiOx/SiNx GI device shows a completely different behavior which suggests some strong compensating mechanisms are at work.

Figure 8:
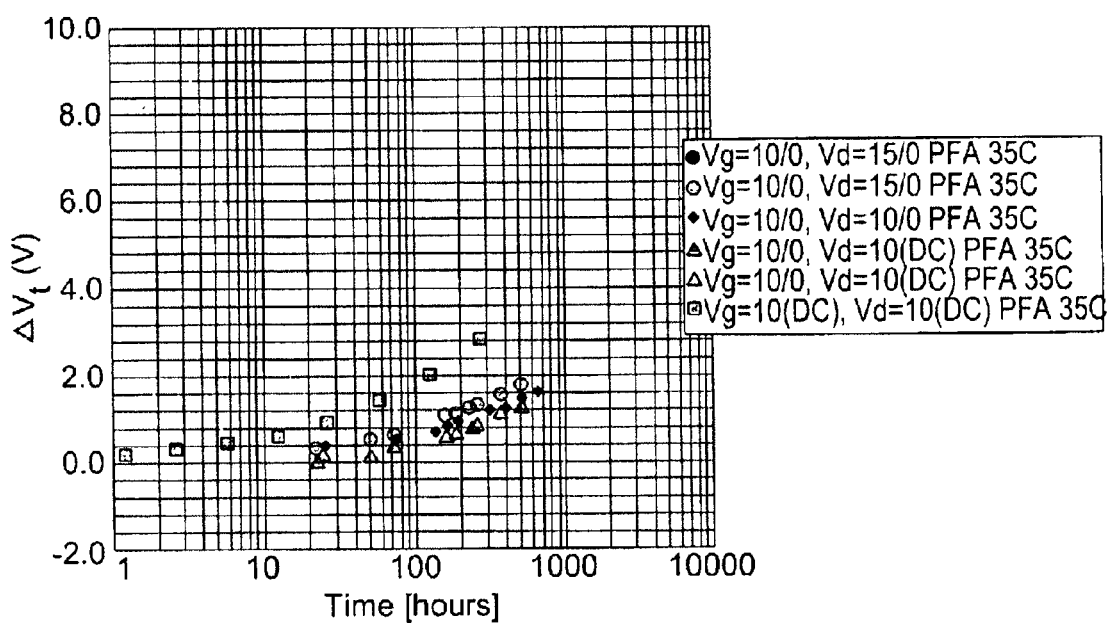
FIG. 8 is a graph demonstrating the AC/DC results at 35° C. under a variety of bias conditions. A constant 10° C. rise in temperature during actual panel operation (average at midgray) should probably be considered an upper limit since it is assumed heat uniformity and removal management, such as heat sinks and forced air movement, are employed. Data on SiOx/SiNy gate insulator TFTs indicate that negative gate bias compensation is likely to further enhance stability in these devices.

The AC/DC results on SiOx/SiNx GI TFTs at 35° C. under a variety of bias conditions are shown in FIG. 8. A constant 10° C. rise in temperature during actual panel operation (average at midgray) should probably be considered an upper limit. Historical data on SiOx/SiNx GI TFTs indicate that negative gate bias compensation is likely to further enhance stability in these devices. These data, taken up to about 600 hours, are very encouraging for some of the reasons outlined earlier. First, they agree with the trend seen for the single layer SiNx deposited GI TFTs where cutting the duty cycle in half decreases the threshold shift by much more than a factor of 2 (3 to 4 in this case). Second, they are taken at about 10° C. above room temperature, which we believe is an upper limit since we have seen noticeable heating effects in the AMOLED display only at the absolute highest bias values corresponding to "full ON" operation—we do not expect this magnitude of heating for full video, midgray averaged driving. Third, both the OLED material and the a-Si TFT have positive temperature coefficients—there would be a truly noticeable increase in brightness in an actual display should the temperature begin to increase by this amount without some automatic brightness feedback control to limit the data voltage. This is an important consideration which will have to be accounted for when testing and specifying the maximum brightness and lifetime of AMOLED displays in general. Finally, a wealth of data on charge compensation behavior in the SiOx/SiNx gate insulator exists suggesting that backplane beyond the data or projections seen thus far. Such compensation might best be understood with the aid of the band diagram shown in FIG. 9.

Figure 9:
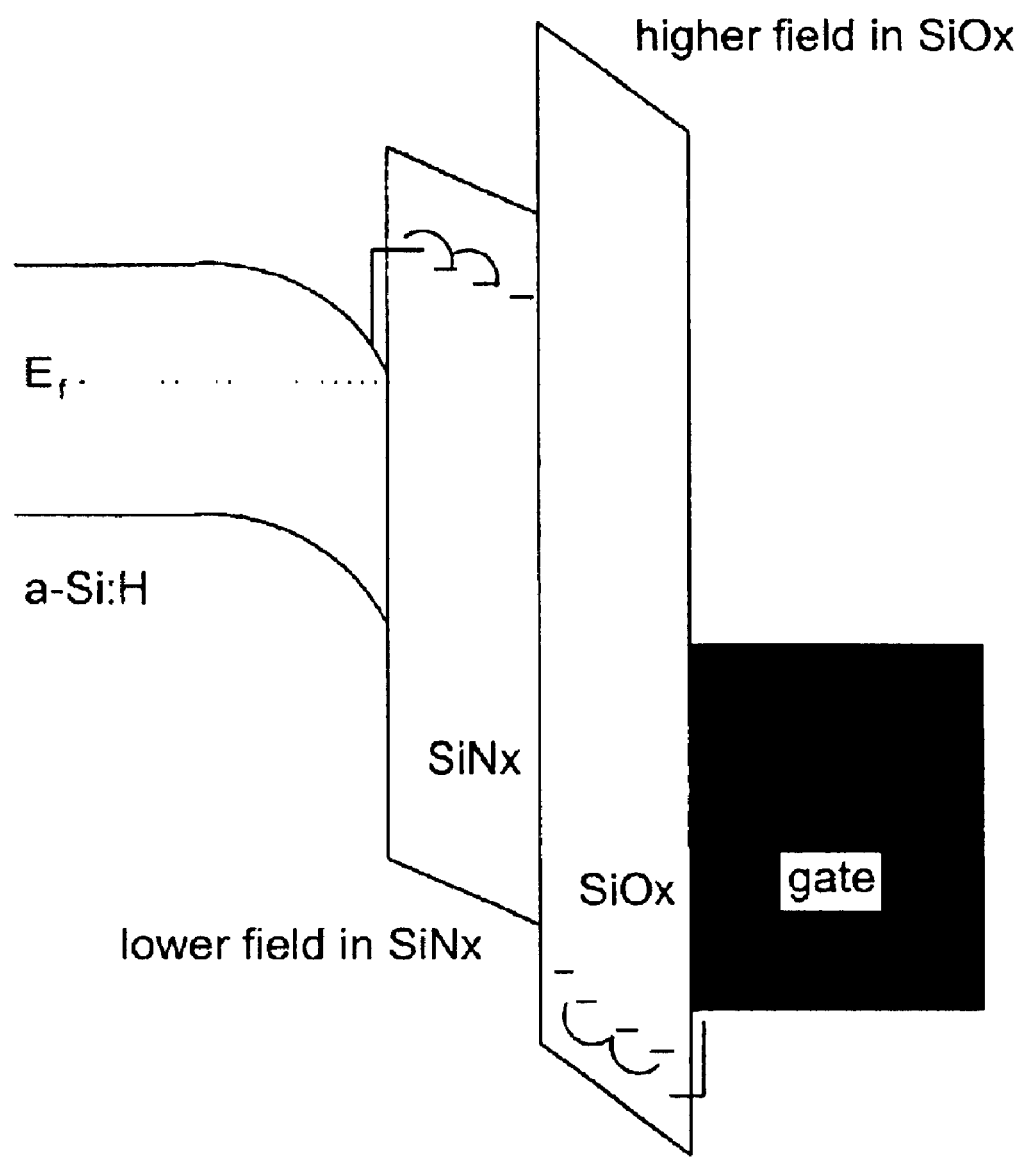
FIG. 9 is a band diagram of composite SiOx/SiNx gate insulator showing reduction of SiNx electric field relative to SiOx, electron injection into SiNx from a-Si, and positive charge moving across SiOx.

Band diagram of composite SiOx/SiNx gate insulator showing reduction of SiNx electric field relative to SiOx, electron injection into SiNx from a-Si, and positive charge moving across SiOx, as shown in FIG. 9. The compensation flow is merely illustrative. Because of the higher dielectric constant of PECVD SiNx relative to SiOx (approximately 7 vs. approximately 4.5), more gate voltage is dropped across the SiOx than the SiNx, hence the electric field (which we know drives injection and trapping of electrons in the SiNx) across the SiNx portion of the GI is reduced proportionally. This in itself is obviously beneficial, but the fact that the data show strong composition behavior (sometimes resulting in a negative threshold shift over some initial period of time) indicates that a competing mechanism of opposite sign charge carrier must be at work on the SiOx side of the GI. The figure is meant to show that compensation can take place, although we do not explicitly suggest that holes hop via trap sites in SiOx the same way electrons hop through SiNx via the Poole-Frenkel mechanism. It behooves us to understand and exploit this behavior as much as we can, since it bodes particularly well for proposed AMOLED negative gate pulse compensation drive schemes.

Figure 10A:
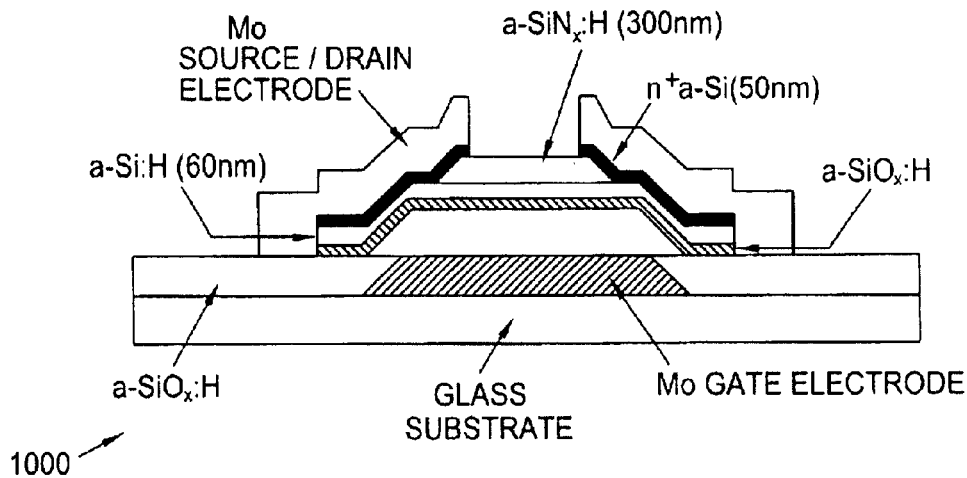
FIGS. 10a and b are a pair of cross-sectional views of a TFT with identical processed films, except that the gate interface film adjacent to the a-Si TFT channel is either (a) CVD SiOx (10a), or (b) CVD SiNy (10b)
Figure 10B:
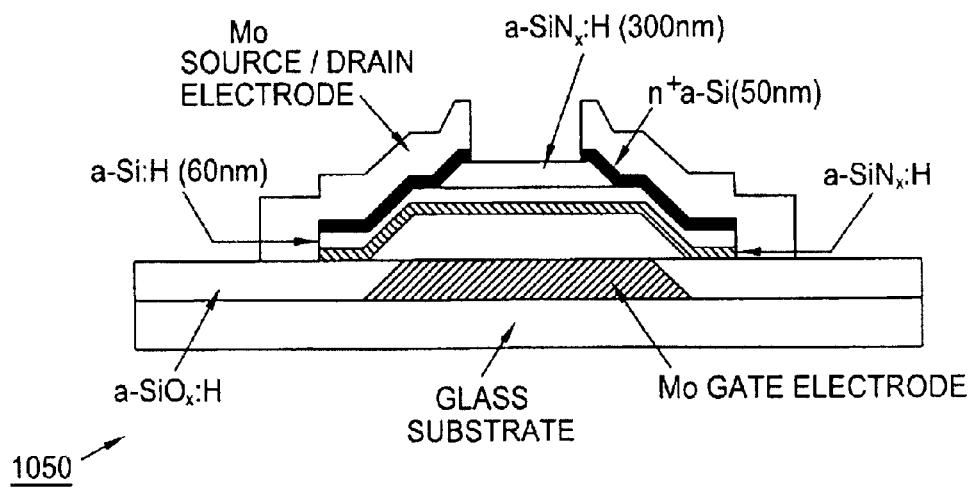

A further improvement in reducing the TFT threshold voltage shift can be understood from FIG. 9, by limiting the electron injection into the SiNx layer, is by providing a good quality SiNx film that exhibits low interface and bulk states in the region of the SiNx layer adjacent to the amorphous silicon layer. As an illustration, cross-sections of TFT with identical processed films except the gate interface film adjacent to the amorphous silicon TFT channel are shown with a poor quality gate layer interface film, for example, CVD SiOx, and with a good quality gate layer interface film, for example, CVD SiNx, in FIG. 10a and FIG. 10b, respectively.

Figure 11A:
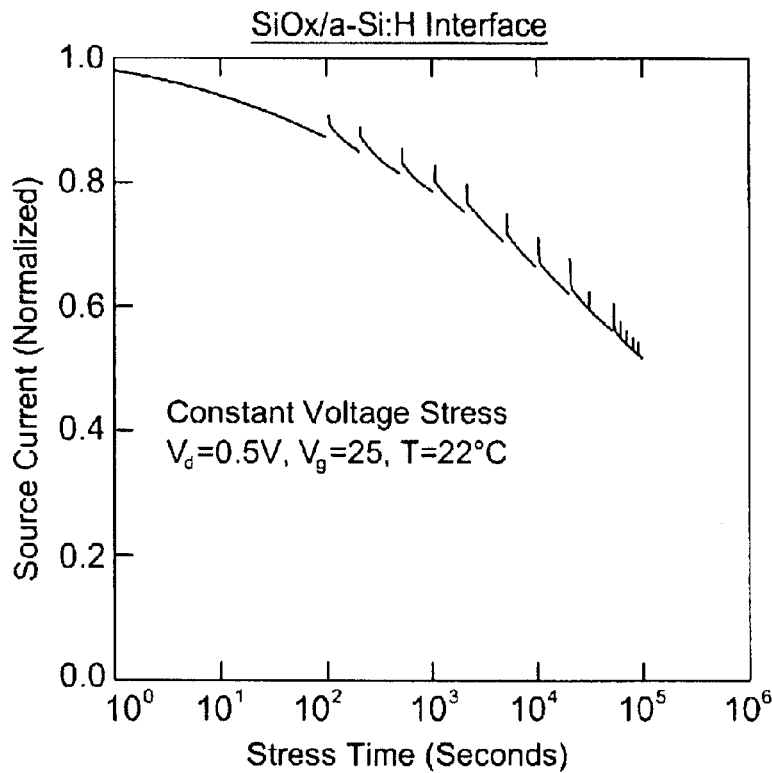
FIGS. 11a–d are graphs depicting the normalized time dependencies of the source to drain on current as a function of stress time (left), and TFT threshold voltage shift versus stress time (right) for the two TFT's with cross-sections containing a gate insulator interface adjacent to the a-Si TFT channel of either CVD SiOx (FIGS. 11a–b), or CVD SiNy (FIGS. 11c–d), corresponding to the TFT cross-sections of FIGS. 10a–b, respectively.
Figure 11B:
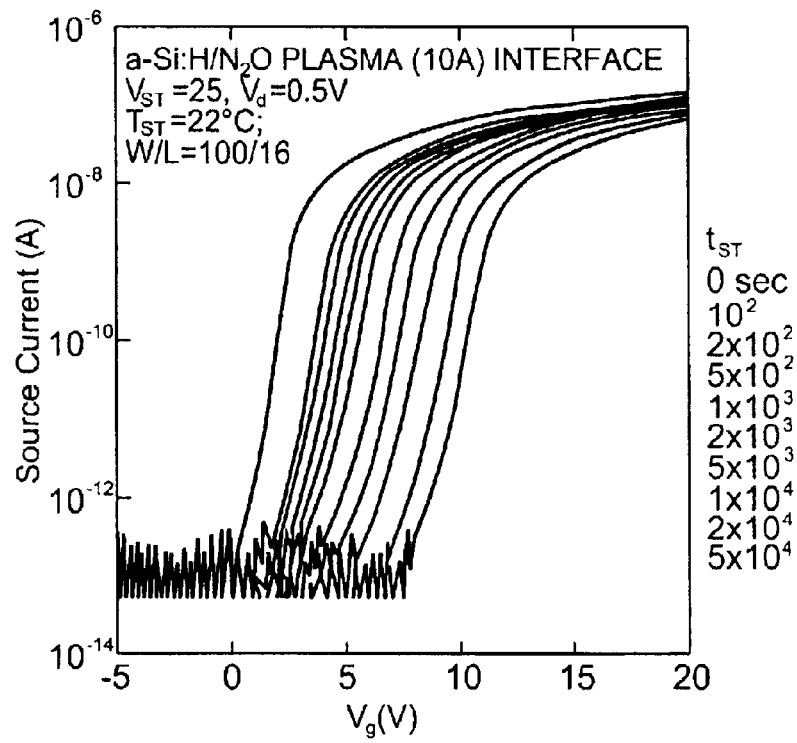
Figure 11C:
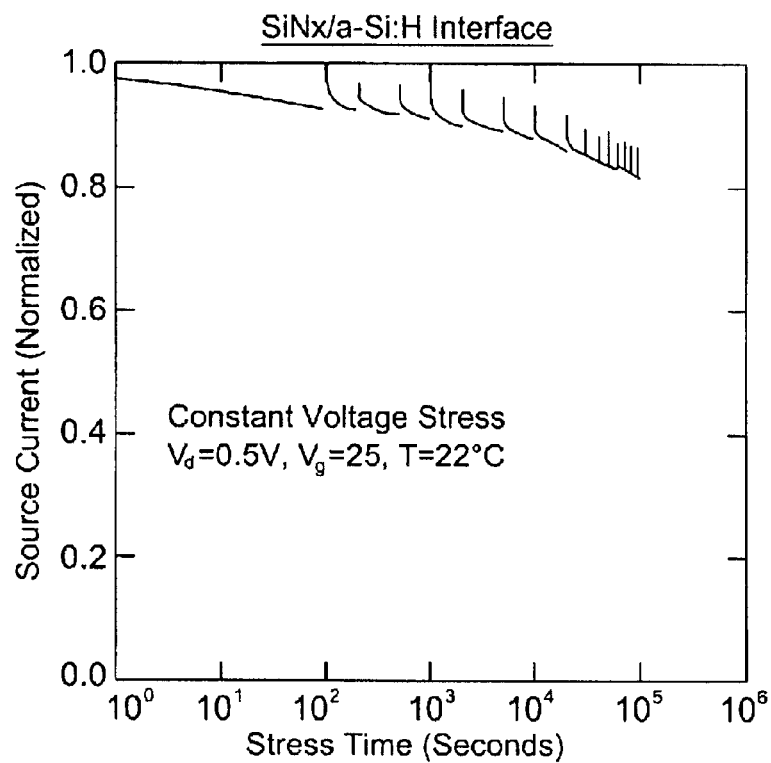
Figure 11D:
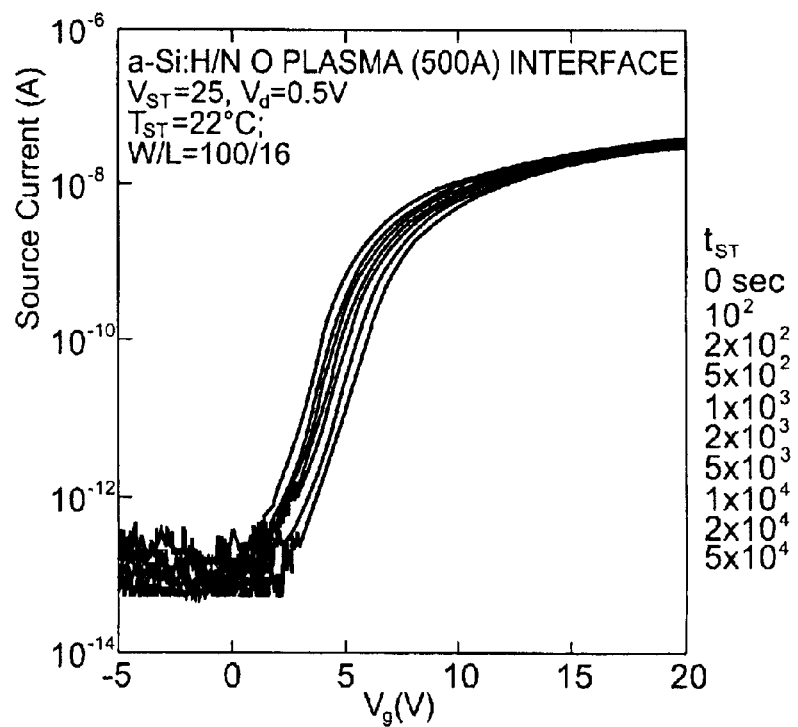

In comparing the TFT source current versus gate voltage characteristics as a function of constant gate bias stress time of FIG. 11b and FIG. 11d, which corresponds to 1000 and 1050, respectively, it is apparent that the threshold voltage shift, which is proportional to the source current versus gate voltage characteristics shift, is approximately a factor of three larger for 1000 compared to 1050. As a further illustration, the normalized time dependence of the source to drain on currents of FIG. 11a and FIG. 11b, which correspond to the 1000 and 1050, respectively, also show approximately a factor of three greater rate of decrease in on current.

Another further improvement in reducing the TFT threshold voltage shift or reducing the rate of decrease in on current can be understood from FIG. 9, is by matching the threshold voltage shift effect of electron injection into the SiNx layer by the reverse polarity threshold voltage shift effect of hole injection into the SiOx film. As an illustration, cross-sections of TFT with identical processed films except the gate interface film adjacent to the gate electrode are shown with a SiOx film allowing hole injection, for example, high temperature, high pressure CVD SiOx, and with a good hole blocking SiOx layer, for example, low temperature, low pressure CVD SiOx, in FIG. 12a and FIG. 12b, respectively.

Figure 13:
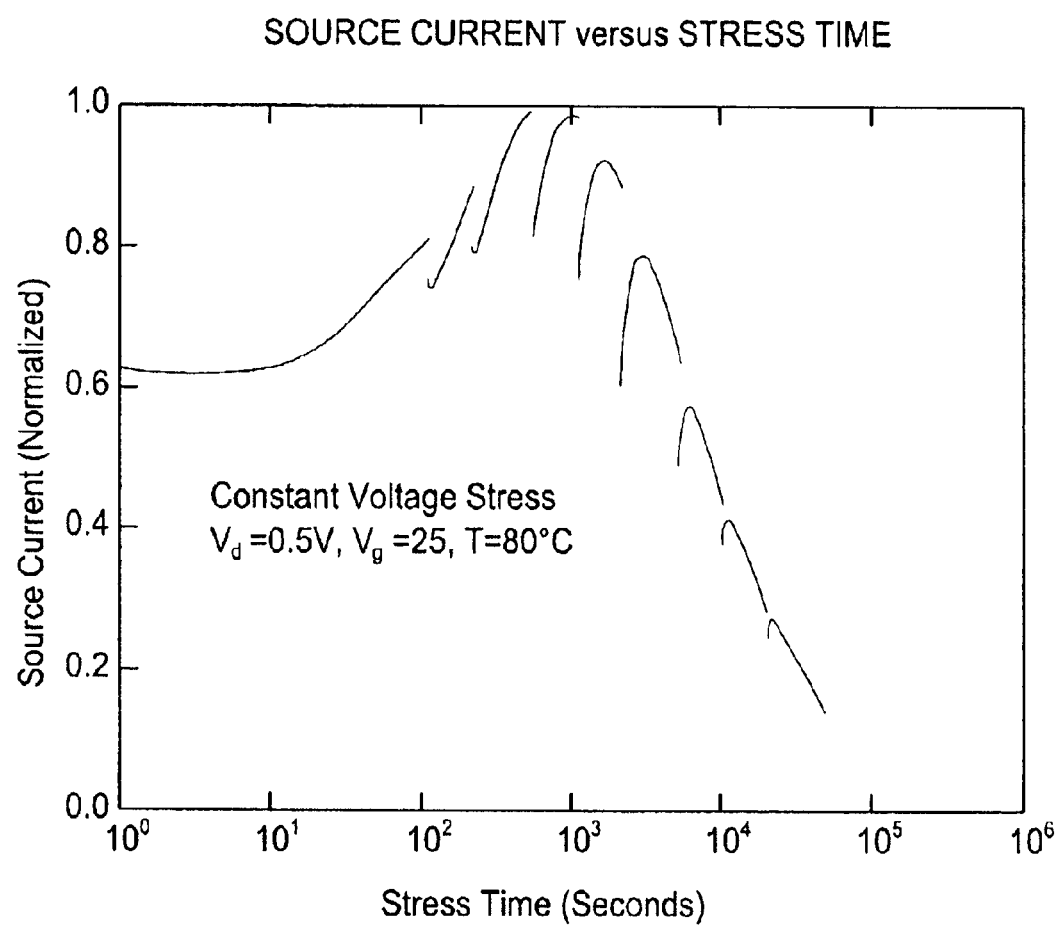
FIG. 13 is a graph depicting the normalized time dependence of the source to drain on current as a function of stress time, corresponding to the TFT cross-sections of FIG. 12b (i.e., the low temperature, low pressure SiOx layer near the Mo gate electrode)
Figure 14:
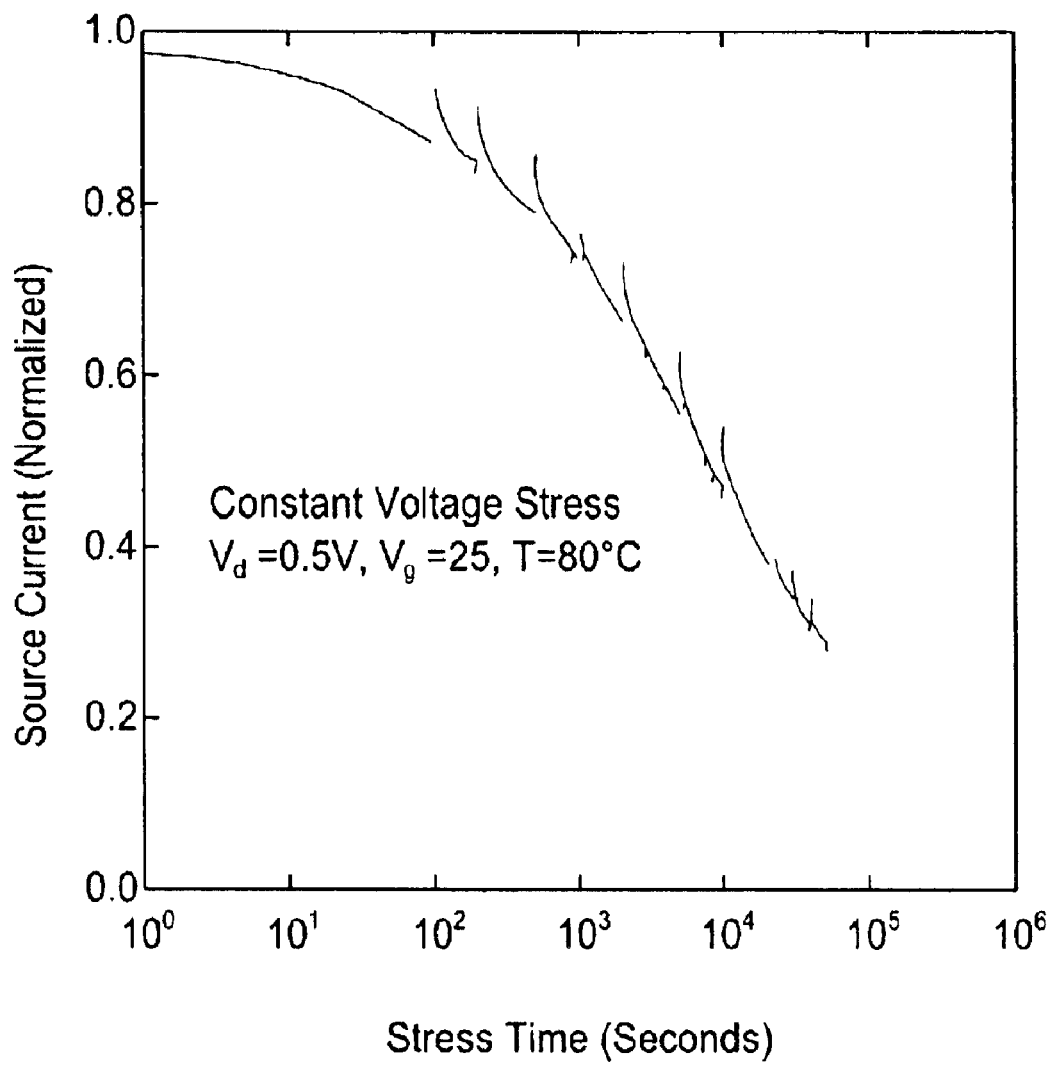
FIG. 14 is a graph depicting the normalized time dependence of the source to drain on current as a function of stress time, corresponding to the TFT cross-sections of FIG. 12a (i.e., high temperature, high pressure SiOx layer near the Mo gate electrode)

In comparing the normalized time dependence of the source to drain on currents of FIG. 13 and FIG. 14, which corresponds to 1250 and 1200, respectively, it is apparent that the threshold voltage shift, which is proportional to the on current shift, is less for 1250 compared to 1200. The difference in on current decrease after 50,000 seconds of constant gate bias stress at 25V at an elevated temperature of 80 C is approximately a factor of two decrease for 1250 versus more than a factor of three decrease for 1200.

Figure 12A:
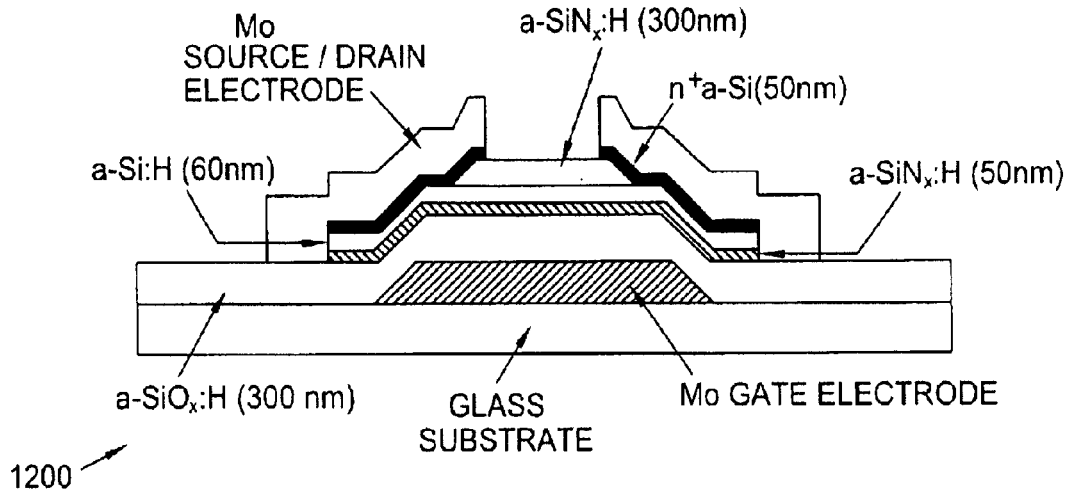
FIG. 12a is a cross-sectional view of a TFT with identical processed films, except that the gate interface film adjacent to the Mo gate electrode is a high temperature, high pressure CVD SiOx.
Figure 12B:
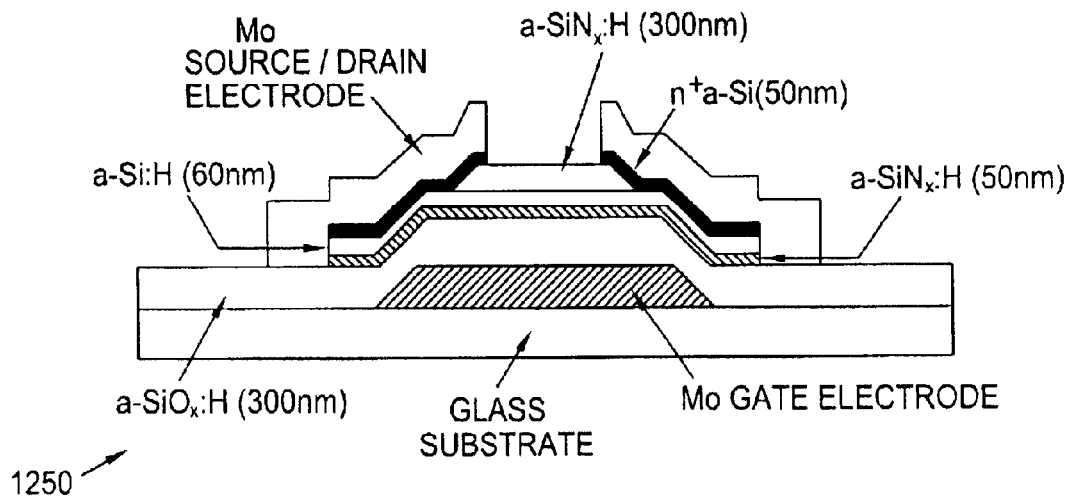
FIG. 12b is a cross-sectional view of a TFT with identical processed films, except that the gate interface film adjacent to the Mo gate electrode is a low temperature, low pressure CVD SiOx.
Figure 15A:
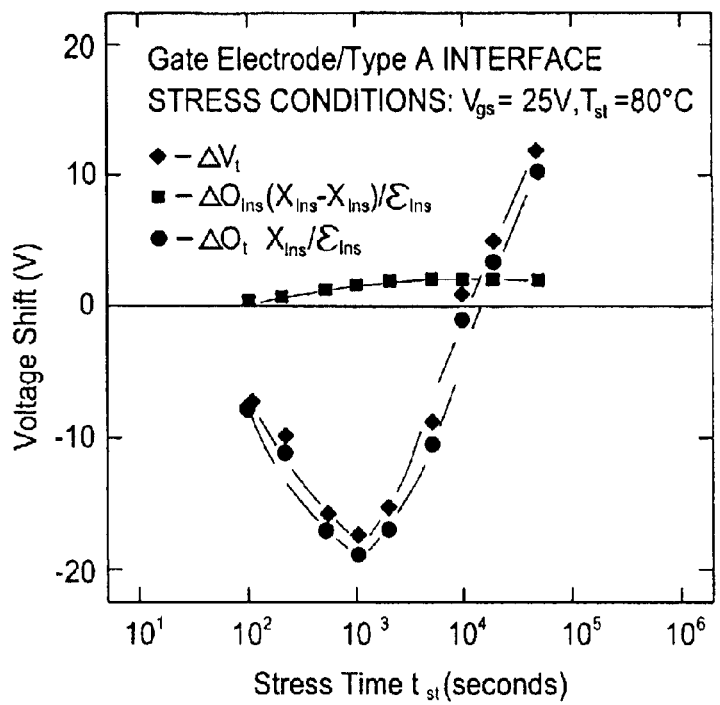
FIG. 15a is a graph plotting total threshold voltage shift (diamonds), which is composed of charge trapping at the interface (squares) and bulk insulator charge trapping (circles), versus stress time for the TFT cross-section of FIG. 12b (i.e., low temperature, low pressure) near the Mo gate electrode.

FIG. 15a is a graph quantifying the total threshold voltage shift (diamonds), which is composed of charge trapping at the interface (squares) and bulk insulator charge trapping (circles), versus stress time for the TFT cross-section of FIG. 12b (i.e., low temperature, low pressure) near the Mo gate electrode.

Figure 15B:
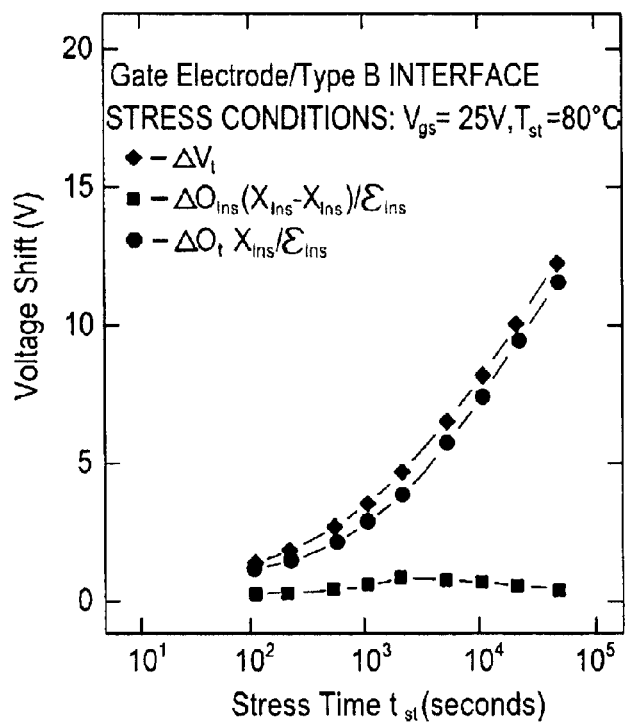
FIG. 15b is a graph plotting total threshold voltage shift (diamonds), which is composed of charge trapping at the interface (squares) and bulk insulator charge trapping (circles), versus stress time for the TFT cross-section of FIG. 12a (i.e., high temperature, high pressure SiOx layer) near the Mo gate electrode.

FIG. 15b is a graph quantifying the total threshold voltage shift (diamonds), which is composed of charge trapping at the interface (squares) and bulk insulator charge trapping (circles), versus stress time for the TFT cross-section of FIG. 12a (i.e., high temperature, high pressure SiOx layer) near the Mo gate electrode.

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications which come within the scope of the appended claims.

What is claimed is:

1. A circuit for providing a current to an organic light emitting diode comprising:
    an amorphous silicon field effect transistor having a gate electrode and a drain electrode through which said current is provided to said organic light emitting diode; and
    a controller for controlling a duration of voltage applied between said gate electrode and said drain electrode to maintain a threshold voltage shift of less than about 1 V,
    wherein said range of duration for applying voltage between said gate electrode and said drain electrode is between about 1% to 99.9% of a frame time.

2. The circuit according to claim 1, wherein said organic light emitting diode is a component in an active matrix.

3. The circuit according to claim 1, wherein said controller is also for controlling a range of voltage applied between said gate electrode and said drain electrode.

4. The circuit according to claim 3, wherein said range of voltage applied between said gate electrode and said drain electrode has a magitude of un to about 25 V.

5. The circuit according to claim 1, wherein said current is in the range from about 10 nA to 10 $\mu$A.

6. The circuit according to claim 1, wherein said field effect transistor is a thin film transistor.

7. The circuit according to claim 1, wherein said field effect transistor comprises:
    a substrate;
    said gate electrode deposited upon a surface of said substrate;
    a first amorphous $SiO_x$ layer disposed on said gate electrode;
    a second amorphous $SiO_x$ or $SiN_x$ layer deposited on at least a portion of said first amorphous $SiO_x$ layer;
    a first amorphous silicon layer deposited on said second amorphous $SiO_x$ or $SiN_x$ layer;
    a third amorphous $SiN_x$ layer deposited on at least a portion of said first amorphous silicon layer;
    a second amorphous silicon layer deposited on a first and second side portions of said third amorphous $SiN_x$ layer;
    said drain electrode deposited on either said first or second side portions of said second amorphous silicon layer; and
    a source electrode deposited on the side portion of said second amorphous silicon layer other than the side portion upon which said drain electrode is deposited.

8. The circuit according to claim 7, wherein, when a bias is applied to said gate electrode, said first amorphous $SiO_x$ layer has a first voltage shift of a first polarity, and said second amorphous $SiO_x$ or $SiN_x$ layer has a second voltage shift of a second polarity that is opposite of said first polarity.

9. The circuit according to claim 7, wherein said a first amorphous $SiO_x$ layer is susceptible to hole injection.

10. The circuit according to claim 7, wherein said second amorphous $SiO_x$ or $SiN_x$ layer is susceptible to electron injection.

11. A field effect transistor comprising:
    a substrate;
    a gate electrode deposited upon a surface of said substrate;
    a first amorphous $SiO_x$ layer disposed on said gate electrode;
    a second amorphous $SiO_x$ or $SiN_x$ layer deposited on at least a portion of said first amorphous $SiO_x$ layer;
    a first amorphous silicon layer deposited on said second amorphous $SiO_x$ or $SiN_x$ layer;
    a third amorphous $SiN_x$ layer deposited on at least a portion of said first amorphous silicon layer;
    a second amorphous silicon layer deposited on a first and second side portions of said third amorphous $SiN_x$ layer;
    a drain electrode deposited on either said first or second side portions of said second amorphous silicon layer; and
    a source electrode deposited on the side portion of said second amorphous silicon layer other than the side portion upon which said drain electrode is deposited,
    wherein, when a bias is applied to said sate electrode, said first amorphous $SiO_x$ layer has a first voltage shift of a first polarity, and said second amorphous $SiO_x$ or $SiN_x$ layer has a second voltage shift of a second polarity that is opposite of said first polarity.

12. The field effect transistor according to claim 11, wherein said a first amorphous $SiO_x$ layer is susceptible to hole injection.

13. The field effect transistor according to claim 11, wherein said second amorphous $SiO_x$ or $SiN_x$ layer is susceptible to electron injection.

* * * * *